United States Patent [19]

Gen-Kuong

[11] Patent Number: 5,001,441
[45] Date of Patent: Mar. 19, 1991

[54] OPERATIONAL TRANSCONDUCTANCE AMPLIFIER PROGRAMMABLE FILTER

[75] Inventor: Fernando Gen-Kuong, Laguna Beach, Calif.

[73] Assignee: Allied-Signal Inc., Morris Township, Morris County, N.J.

[21] Appl. No.: 428,689

[22] Filed: Oct. 30, 1989

[51] Int. Cl.$^5$ .............................................. H03F 1/32
[52] U.S. Cl. ................................. 330/294; 330/107; 330/306
[58] Field of Search ............... 330/107, 294, 303, 305, 330/306; 307/520; 328/167

[56] References Cited

U.S. PATENT DOCUMENTS

4,839,542  6/1989  Robinson ........................... 307/520

Primary Examiner—James B. Mullins
Attorney, Agent, or Firm—Robert C. Smith; Jerry J. Holden; Robert A. Walsh

[57] ABSTRACT

A general biquadratic filter circuit is described which uses operational transconductance amplifiers. A bias current controls the transconductance (gm) of the amplifiers which in turn control the corner frequency (Wo) of the circuit. The circuit is configured with three potential sources which can be preselected to either be at a ground level or at a desired voltage level. By preselecting which of the potentials are grounded and which are at a desired voltage level, the circuit can become either a lowpass, highpass, bandpass or notch filter.

19 Claims, 6 Drawing Sheets

OPERATIONAL TRANSCONDUCTANCE AMPLIFIER PROGRAMMABLE FILTER

This invention relates to electronic filter circuits and more particularly to an operational transconductance amplifier programmable filter circuit which, with very minor modifications, can be configured as any of a number of filter sections such as lowpass, highpass, bandpass, or notch filter and whose corner frequency can be changed by changing the amount of bias current to the circuit.

BACKGROUND OF THE INVENTION

For many filtering applications it is usual to employ switched capacitor filtering arrangements. Besides requiring that each circuit be essentially custom designed for any particular application, such switched capacitor circuits have some disadvantages of their own. Switched capacitor circuits are good only as lowpass filters in wide band applications. A clock is required to control the corner frequency and the clock frequency often falls within the frequency band of interest. A further problem is that the clock often introduces undesired noise.

State variable circuits using operational amplifiers can also be used in some applications, but they require digital to analog converters. Since the number of digital to analog converters increases with filter order, such filters become very expensive as the filter order increases. It is therefore quite desirable to create a basic filter circuit which can be implemented into a single integrated circuit and which with very small changes can be used in a number of different applications.

SUMMARY OF THE INVENTION

Applicant has devised a general biquadratic filter circuit using operational transconductance amplifiers whose transconductance (gm), which is dependent upon the bias current, is used to control the corner frequency (Wo) of the biquadratic section. The corner frequency can be programmed by varying the bias current over a range of three decades. By changing capacitance values, one can get corner frequency values ranging from 0.1 $H_z$ to 100K $H_z$, a range which cannot be obtained from switched capacitor circuits. With applicant's filter there is no need for an anti-aliasing filter, smoothing filter, nor a clock filter which, in some analog applications could be undesirable. Any of these may be required in switched capacitor circuits.

Another advantage of applicant's filter circuit is that the output can be taken directly from the operational amplifier, therefore it has a low output impedance which is desirable when driving stages with poor, or low, input impedance as in the case of operational transconductance amplifiers.

Applicant's design permits several filter circuits to be implemented in a single semi-custom integrated circuit which makes it possible to improve transconductance matching and tracking with temperature variations.

From the foregoing it will be recognized that it is an object of this present invention to provide a filter circuit having small size, low cost and excellent performance and which can be used in a wide range of different applications.

DESCRIPTION OF THE PREFERRED EMBODIMENTS

Figure 1:
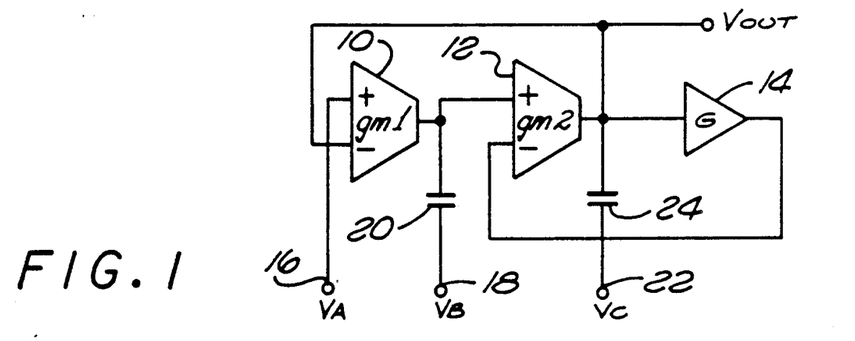
FIG. 1 is a block diagram of a general biquadratic filter section according to my invention.

Referring now to FIG. 1, a general biquadratic section is shown in which operational transconductance amplifiers (OTAs) 10 and 12 are connected in series and in which an additional operational amplifier 14 is connected to the output of OTA 12. Input potentials are, or may be, connected to a terminal 16 connected to the positive terminal of OTA 10, a terminal 18 through a capacitor 20 connected to the positive input terminal of OTA 12, and a terminal 22 connected through a capacitor 24 to a junction 26 between the output of OTA 12 and the input of an operational amplifier 14 having gain G. An output terminal 28 is connected to junction 26 and also to the inverting terminal of OTA 10.

Equation (1) describes the transfer function for the circuit of FIG. 1. This equation can be rewritten in terms of filter corner frequency $W_o$ and Quality factor Q (Equation(2)).

$$V_{out} = \frac{VA \frac{gm1\ gm2}{C1\ C2} + VB \frac{gm2}{C2} S + VC\ S^2}{S^2 + G \frac{gm2}{C2} S + \frac{gm1\ gm2}{C1\ C2}} \quad (1)$$

$$V_{out} = \frac{VA\ W^2{}_o + VB\ G^{-1}(Wo/Q)S + VC\ S^2}{S^2 + (Wo/Q)\ S + W_o{}^2} \quad (2)$$

$$a = gm1/gm2 \quad Wo = (gm2/C1)\ a/b$$

-continued $$b = C2/C1 \quad Q = \frac{ab}{G}$$

Figure 2:
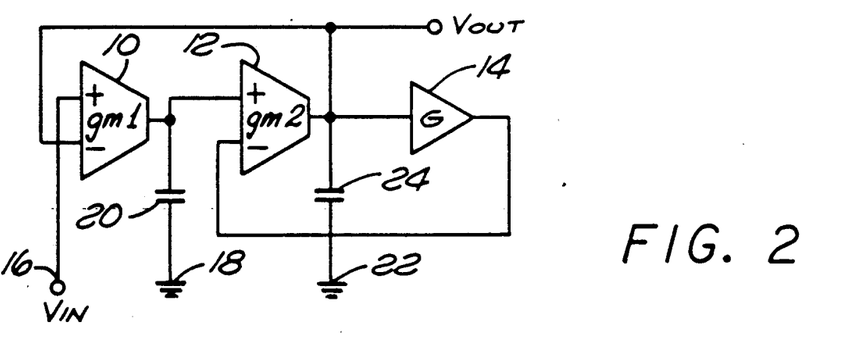
FIG. 2 is a block diagram of the filter section of FIG. 1 configured as a second order low-pass filter section.

From equation (2) it can be seen that by choosing VA, VB and VC, different filter configurations can be obtained. Thus as shown in FIG. 2, where VB=VC=0, (terminals 18 and 22 at ground) and VA (terminal 16)=Vin, then the transfer function of a low-pass filter is obtained.

Figure 3:
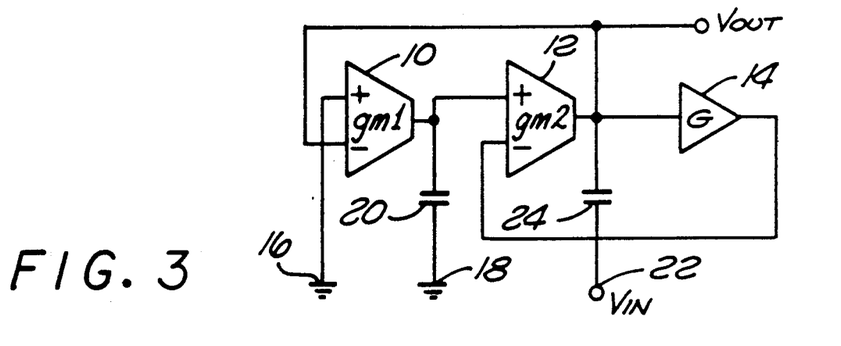
FIG. 3 is a block diagram of the filter section of FIG. 1 as a second order high-pass filter section.
Figure 4:
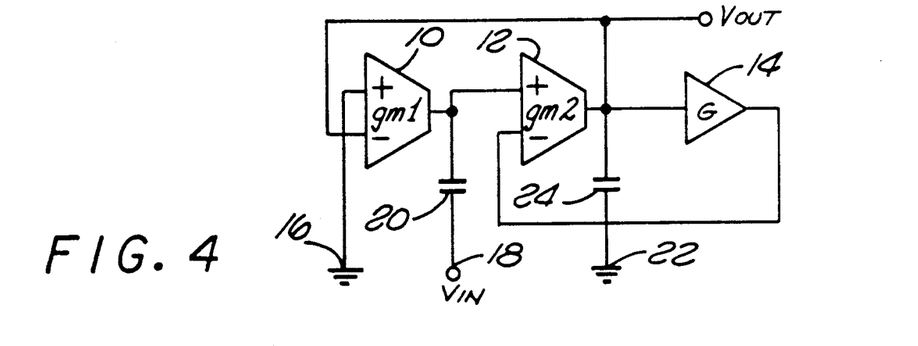
FIG. 4 is a block diagram of the filter section of FIG. 1 configured as a second order band-pass-filter section.
Figure 5:
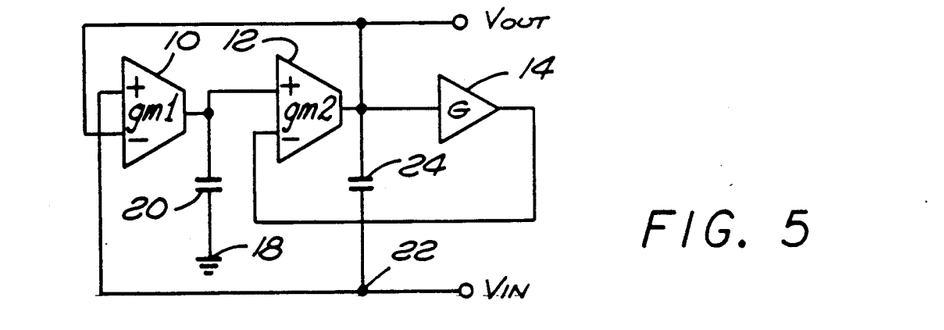
FIG. 5 is a block diagram of the filter section of FIG. 1 configured as a second order band-reject filter section.

FIG. 3 shows the circuit of FIG. 1 wherein VA−VB=0 (terminals 16 and 18 at ground) and VC=Vin (terminal 22). This produces the transfer function of a highpass filter. In FIG. 4, VA=VC=0 (terminals 16 and 22 at ground) and VB=Vin (terminal 18) producing the transfer function of a bandpass filter. If VB=0. (terminal 18 at ground) and VA=VC=Vin (terminals 16 and 22) as shown in FIG. 5, the transfer function of a notch (band-reject) filter is obtained.

Figure 6:
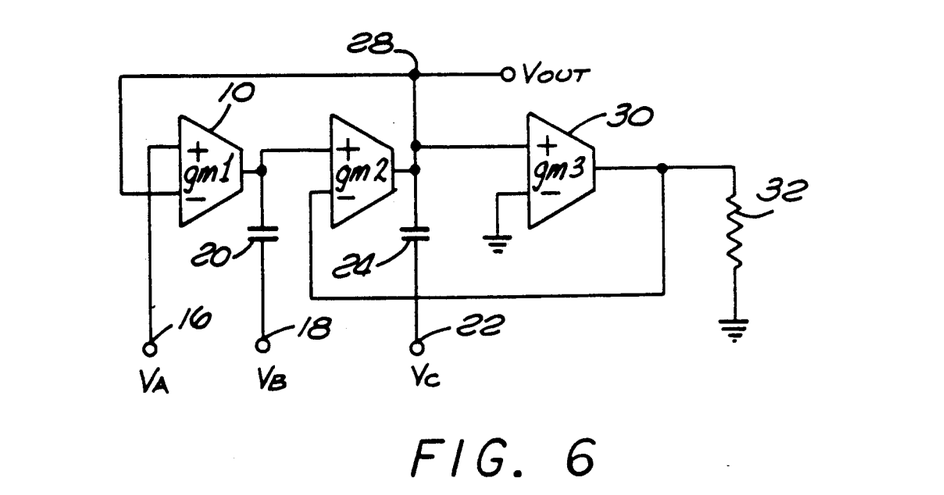
FIG. 6 is a block diagram of a second order low-pass filter section with three operational transconductance amplifiers.

FIG. 6 shows one way in which the gain stage G can be implemented. In this circuit G (gain) will be given by the product of gm3 from OTA 30 and the resistance of resistor 32. The disadvantage of this circuit is that Q will depend upon gm3 which, in turn, depends on temperature.

Figure 7:
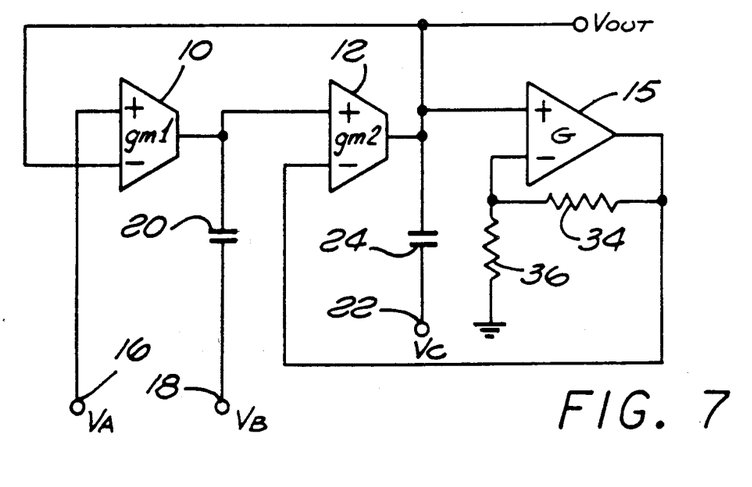
FIG. 7 is a block diagram of a low-pass filter section with two operational transconductance amplifiers and one operational amplifier having a gain greater than unity.
Figures 8, 9:
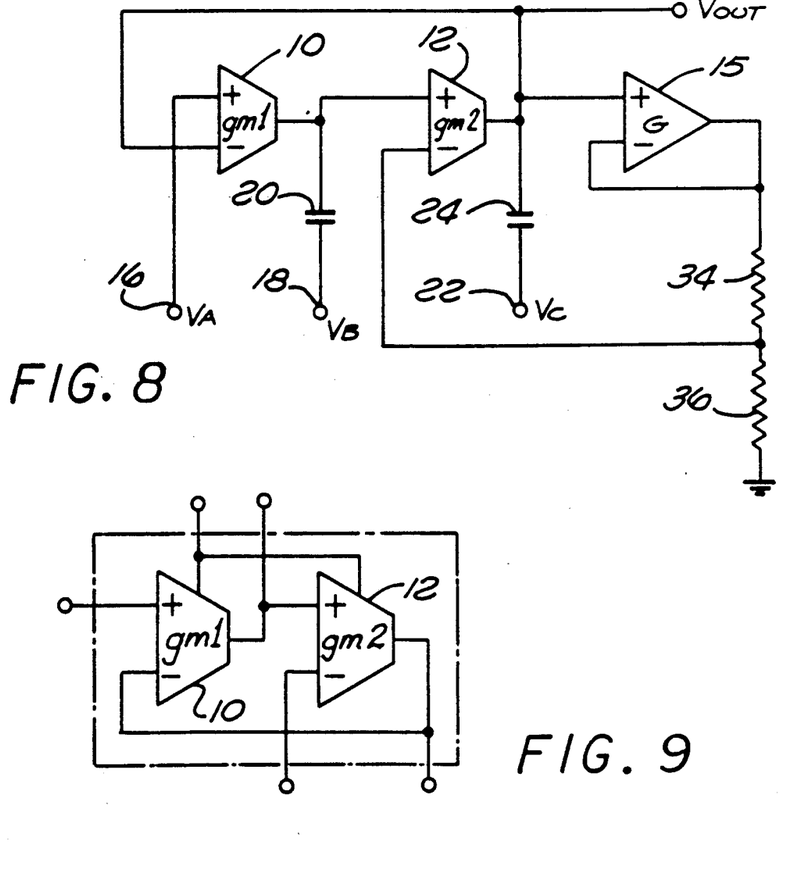
FIG. 8 is a block diagram of a low pass filter section with two operational transconductance amplifiers and an operational amplifier having a gain less than unity.
FIG. 9 is a block diagram of a single biquadratic circuit which can be implemented in a semi-custom integrated circuit.

In FIGS. 7 and 8, G is implemented by using an operational amplifier 15. In either of these configurations G depends on the ratio of the resistors 34 and 36 (R34/R36) and therefore Q will be independent of temperature. In FIG. 7, G is greater than 1; in FIG. 8 where resistors 34 and 36 are connected differently G is less than 1. An advantage of the above circuits is that the output, in addition to being taken as shown, could be taken directly from the output of the operational amplifier 15, thereby achieving a low output impedance which is highly desirable when driving stages with poor input impedance (as in the case of OTAs).

FIG. 9 is a configuration in a single biquadratic amplifier using OTAs 10 and 12 that can be implemented in a semi custom integrated circuit. As shown, five external connecting pins are required per biquad section. To complete the second order circuit as shown in FIGS. 7 and 8, for example, requires in addition, one operational amplifier, two resistors, two capacitors and one optional resistor to control bias current. To make a sixth order filter six OTAs will be needed which can be implemented in a single semi custom integrated circuit to improve transconductance matching and tracking with temperature. Additional operational amplifiers could also be implemented in the integrated circuit but using commercially available operational amplifiers will normally be more economical and may provide better performance. Where six such OTA's are implemented in a single integrated circuit to form a sixth order filter, a total of eighteen connecting pins will be required, five for each such biquadratic amplifier as described above plus one for a ground connection and two additional control pins to receive the desired bias currents. If a single control current pin is used for all three biquadratic sections, a total of sixteen pins will be needed but this will reduce flexibility in the way the chip can be used (A single control line would limit the filter to Butterworth configurations).

Figure 10:
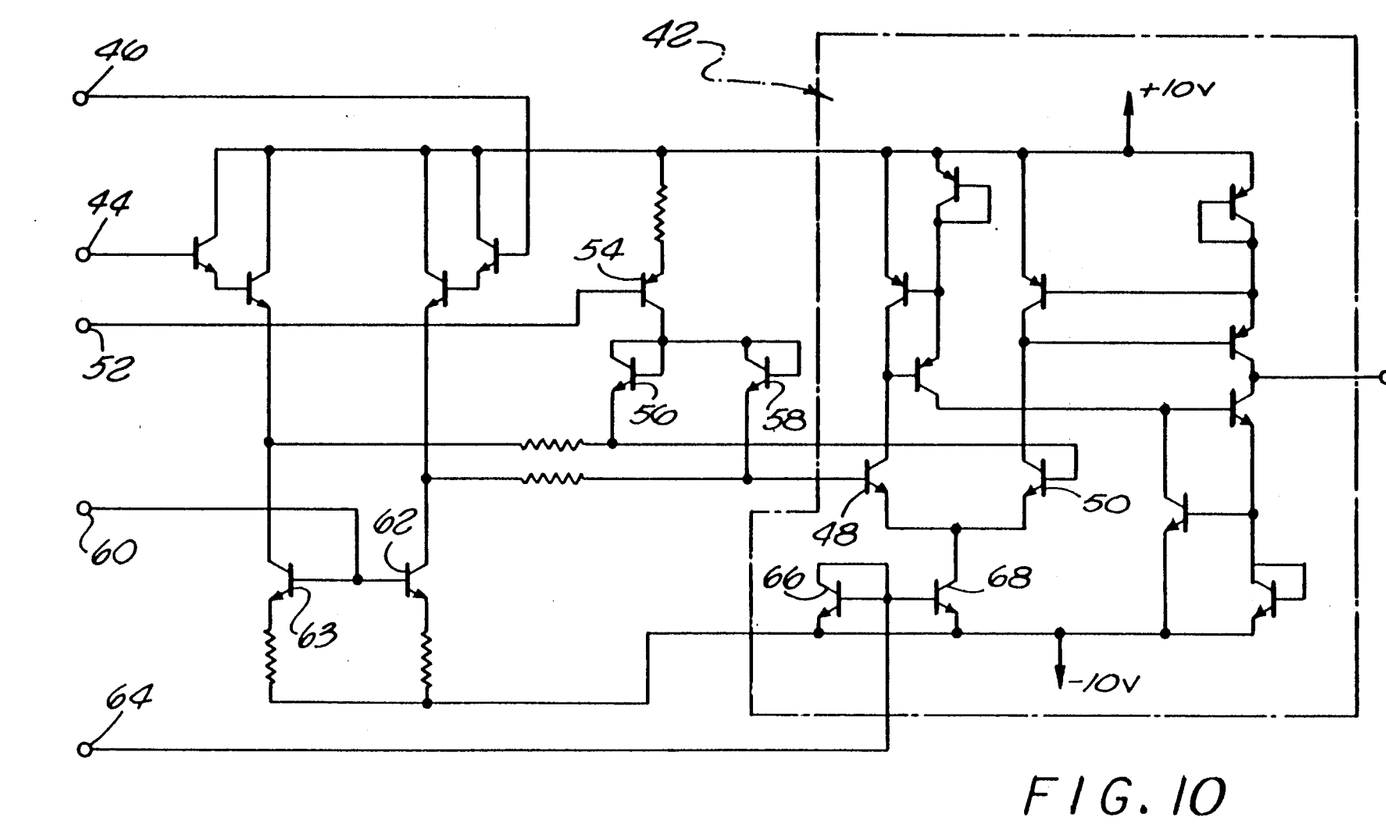
FIG. 10 is a schematic diagram of an operational transconductance amplifier of a type usable in the circuits of FIGS. 1 through 9.

FIG. 10 is a schematic diagram of an operational transconductance amplifier suitable for use in the above circuits. The organization 42 shown within the dashed outline constitutes a commercially available OTA available from National Semiconductor Company or RCA. Since this circuit is available commercially, it will not be described in detail. Additional buffer circuitry has been added to reduce temperature sensitivity, to provide increased input impedance, and to provide greater linearity. This entire organization as shown in FIG. 10 constitutes, for example, either of OTAs 10 or 12 of FIGS. 1 through 9. The input voltage, which is to be filtered, is connected to a terminal 44, and in inverted form to a terminal 46, both of which are connected to a conventional emitter-follower stage using darlington pair NPN transistors before being supplied to one of two input transistors 48 and 50 in the commercially available unit 42. Also connected to these input transistors in unit 42 are inputs from bias circuits, described below, a bias signal from a positive voltage source is connected through a terminal 52 to the base of a PNP transistor 54 which is connected to a pair of interconnected transistors 56 and 58 each of which is connected to one of the two input transistors 48 and 50 in unit 42. A bias signal from a negative voltage source is connected through a terminal 60 to a pair of interconnected transistors 62 and 63 which are, in turn, connected to input transistors 48 and 50 in unit 42. A control signal is applied to a terminal 64 and is supplied to the base electrodes of transistors 66 and 68. A control signal applied to the OTA serves to vary the corner frequency of the filter section.

Figure 11:
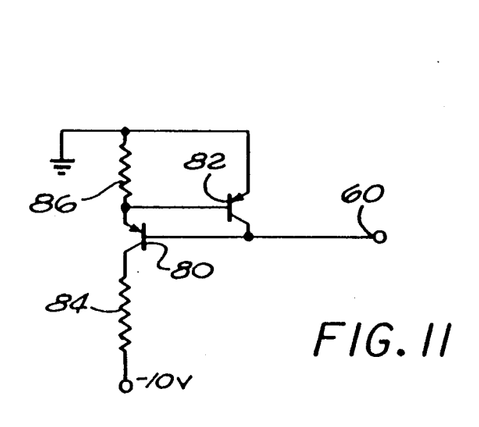
FIG. 11 is a schematic diagram of a bias circuit connected to a positive voltage source used with the operational transconductance amplifier of FIG. 10.
Figure 12:
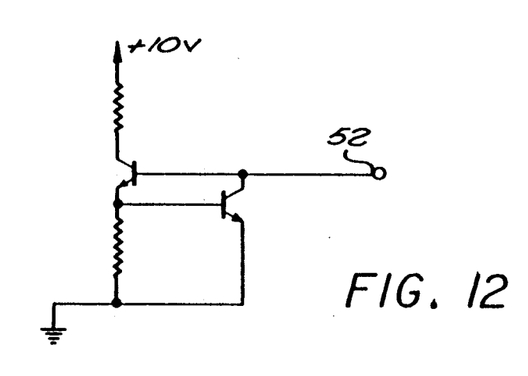
FIG. 12 is a schematic diagram of a bias circuit connected to a negative voltage source used with the operational transconductance amplifier of FIG. 10.

FIG. 11 is a schematic diagram of a bias circuit connected to a negative voltage source and which could be connected to terminal 46 of FIG. 10 and comparable terminals of other OTAs. A pair of interconnected transistors 80 and 82 are connected to a resistor 84 connected to the negative voltage source (typically −10 v) and to a second resistor 86 connected to ground. FIG. 12 is an analogous bias circuit with transistors of opposite polarity types connected between a positive voltage source (such as +10 v) and ground.

Figure 13:
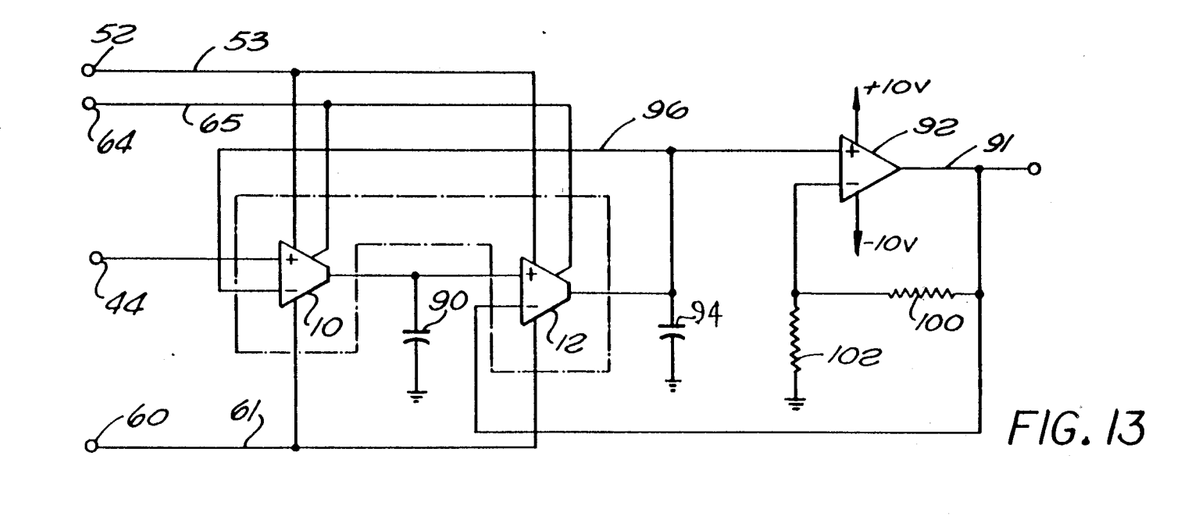
FIG. 13 is a schematic diagram of a second order filter section utilizing the biquadratic circuit of FIG. 9.

FIG. 13 is a schematic diagram of a second order filter circuit wherein the biquadratic circuit of FIG. 9 is shown in dashed outline. Each of OTAs 10 and 12 are as shown in detail in FIG. 10. The input terminals receive the same inputs as those shown in FIG. 10, wherein terminal 64 provides the control signal on a line 65, the positive bias input signal is at terminal 52 and carried on line 53, the negative bias input signal is connected to terminal 60 and carried on line 61 and the input signal to be filtered appears at terminal 44. (In this case only the + input is shown). The output of OTA 10 is connected to the input of OTA 12 and to a capacitor 90 whose opposite side is connected to ground. The output of OTA 12 is connected to the input of an operational amplifier 92, to a capacitor 94 connected to ground and to a feedback line 96 connected to the negative input terminal of OTA 10. The output of operational amplifier 92 on a conductor 91 is the output of the filter section. A first feedback loop is connected to a voltage divider consisting of a resistor 100 and a resistor 102 having one side connected to ground. A point between resistors 100 and 102 is connected to the negative input terminal of operational amplifier 92. The second feedback loop, also connected to conductor 91, and one side of resistor 100, is connected to the negative input terminal of OTA 12. It will be observed that this second order filter section is similar to that shown in FIG. 7.

Figure 14:
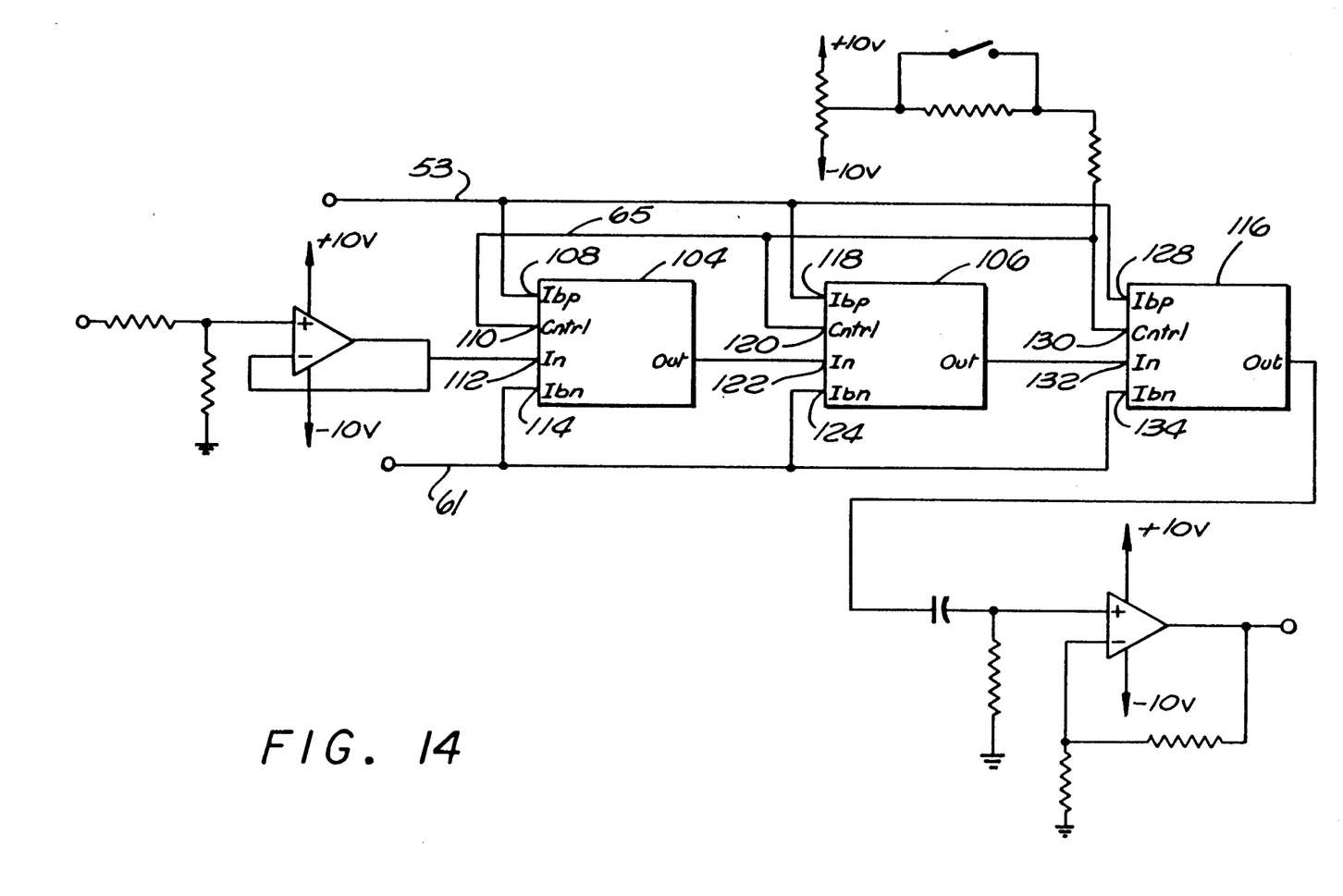
FIG. 14 is a block diagram of a sixth order low-pass filter utilizing a plurality of second order filter sections like that of FIG. 13.

FIG. 14 is a schematic diagram of a sixth order variable low-pass filter according to the present invention. In this figure, blocks 104 and 106 are essentially identical to the organization of FIG. 13. In block 104 the input terminals 108, 110, 112 and 114 correspond directly to input terminals 52, 64, 44 and 60 FIG. 13, respectively. Block 106 is very similar to the organization of FIG. 13 except for the arrangement of the output resistors which are connected like resistors 34 and 36 of FIG. 8. Similarly input terminals 118, 120, 122 and 124 of block 106 and terminals 128, 130, 132, and 134 of block 116 would also correspond directly to terminals 52, 64, 44 and 60 of FIG. 13 respectively. A single positive bias line 53 and a single negative bias line 61 are connected to each block. A single control line 65 is also connected to each block. It is convenient to form each of the OTAs 10 and 12 of each of blocks 104, 016 and 116 in a single semi-custom integrated circuit. This can then conveniently be added to a board carrying the remaining operational amplifiers and discrete components.

While applicant has disclosed a limited number of embodiments herein, it is recognized that those skilled in the art will become aware of modifications and I do not desire to be limited to the specific embodiments shown and described.

I claim:

1. An operational transconductance amplifier programmable second order filter circuit comprising a first operational transconductance amplifier having a positive input terminal, an inverting input terminal, and an output terminal;
    a first potential source connected to said positive input terminal;
    a second operational transconductance amplifier having a second positive input terminal, connecting means including a first junction connecting said second positive input terminal to said output terminal, a second inverting input terminal, a second output terminal, a second connecting means including a second junction connected to said second output terminal and amplifier means connected to said second junction, said amplifier means having an output connected to said second inverting input terminal;
    a capacitor connected to said first junction and to a second potential source;
    a second capacitor connected to said second junction and to a third potential source;
    means connecting the inverting input terminal of said first operational transconductance amplifier to said second junction; and
    said filter circuit having a configuration in which the said first, second, and third potential sources can each be preselected to be either grounded or at a desired voltage level.

2. An operational transconductance amplifier programmable filter circuit as claimed in claim 1 wherein said amplifier means is an operational amplifier that varies the quality factor (Q) of said circuit.

3. An operational transconductance amplifier programmable filter circuit as claimed in claim 2 wherein said means connecting the inverting input terminal of said first transconductance amplifier to said second junction is also connected to the input terminal of said operational amplifier.

4. An operational transconductance amplifier programmable filter circuit as claimed in claim 3 wherein bias circuit means is connected to said first and second operational transconductance amplifiers.

5. An operational transconductance amplifier programmable filter circuit as claimed in claim 4 wherein said bias means includes circuits connected to both positive and negative voltage sources.

6. An operational transconductance amplifier programmable filter circuit as claimed in claim 3 including three groups of said operational transconductance amplifier programmable filter circuits connected in series, control circuit means and bias circuit means are connected to each of said operational transconductance amplifier programmable filter circuits, a second operational amplifier is connected to the input circuit of the first said operational transconductance amplifier programmable filter circuit and a third operational amplifier is connected to the output of the third said operational transconductance amplifier programmable filter circuit.

7. An operational transconductance amplifier programmable filter circuit as claimed in claim 2 wherein the output of said operational amplifier is connected to a voltage divider connected to ground with an intermediate point of said voltage divider connected to the inverting terminal of said operational amplifier.

8. An operational transconductance amplifier programmable filter circuit as claimed in claim 2 wherein the output of said operational amplifier is connected to its inverting terminal and also to a voltage divider connected to ground with an intermediate point thereof connected to the inverting terminal of said second operational transconductance amplifier.

9. An operational transconductance amplifier programmable filter circuit as claimed in claim 1 wherein said amplifier means is an operational transconductance amplifier whose positive input terminal is connected to said second junction, whose output terminal is also connected through a resistor to ground and whose inverting terminal is connected to ground and said means connecting having an output terminal between said first operational transconductance amplifier and said second junction.

10. An operational transconductance amplifier programmable filter circuit as claimed in claim 1 wherein said second and third potential sources are at ground potential and said first potential source is at a desired voltage value.

11. An operational transconductance amplifier programmable filter circuit as claimed in claim 1 wherein said first and second potential sources are at ground potential and said third potential source is at a desired voltage value.

12. An operational transconductance amplifier programmable filter circuit as claimed in claim 1 wherein said first and third potential sources are at ground level and said second potential source is at a desired voltage value.

13. An operational transconductance amplifier programmable filter circuit as claimed in claim 1 wherein said second potential source is at ground level and said first an third potential sources are connected together and are at a desired voltage level.

14. An operational transconductance amplifier programmable filter circuit comprising a first operational transconductance amplifier having a positive input terminal, an inverting input terminal, and an output terminal;
    a first potential source connected to said positive input terminal;
    a second operational transconductance amplifier having a second positive input terminal, connecting means including a first junction connecting said second positive input terminal to said output terminal, a second inverting input terminal, a second output terminal, a second connecting means including a second junction connected to said second output terminal and amplifier means connected to said second junction, said amplifier means having an output connected to said second inverting terminal;

a capacitor connected to said first junction and to a second potential source;

a second capacitor connected to said second junction and to a third potential source;

means connecting the inverting input terminal of said first operational transconductance amplifier to said second junction; and said first and second potential sources being at a ground potential and said third potential source being at a desired voltage value.

15. An operational transconductance amplifier programmable filter circuit comprising a first operational transconductance amplifier having a positive input terminal, an inverting input terminal, and an output terminal;

a first potential source connected to said positive input terminal;

a second operational transconductance amplifier having a second positive input terminal, connecting means including a first junction connecting said second positive input terminal to said output terminal, a second inverting input terminal, a second output terminal, a second connecting means including a second junction connected to said second output terminal and amplifier means connected to said second junction, said amplifier means having an output connected to said second inverting terminal;

a capacitor connected to said first junction and to a second potential source;

a second capacitor connected to said second junction and to a third potential source;

means connecting the inverting input terminal of said first operational transconductance amplifier to said second junction; and said first and third potential sources are at ground level and said second potential source is at a desired voltage value.

16. An operational transconductance amplifier programmable filter circuit comprising a first operational transconductance amplifier having a positive input terminal, an inverting input terminal, and an output terminal;

a first potential source connected to said positive input terminal;

a second operational transconductance amplifier having a second positive input terminal, connecting means including a first junction connecting said second positive input terminal to said output terminal, a second inverting input terminal, a second output terminal, a second connecting means including a second junction connected to said second output terminal and amplifier means connected to said second junction, said amplifier means having an output connected to said second inverting terminal;

a capacitor connected to said first junction and to a second potential source;

a second capacitor connected to said second junction and to a third potential source;

means connecting the inverting input terminal of said first operational transconductance amplifier to said second junction; and said second potential source is at ground level and said first and third potential sources are connected together and are at a desired voltage level.

17. An operational transconductance amplifier programmable filter circuit comprising a first operational transconductance amplifier having a positive input terminal, an inverting input terminal, and an output terminal;

a first potential source connected to said positive input terminal;

a second operational transconductance amplifier having a second positive input terminal, connecting means including a first junction connecting said second positive input terminal to said output terminal, a second inverting input terminal, a second output terminal, a second connecting means including a second junction connected to said second output terminal and an operational amplifier connected to said second junction, said operational amplifier having an inverting input terminal and having an output connected to a voltage divider connected to ground with an intermediate point of said voltage divider connected to said inverting input terminal of said operational amplifier;

a capacitor connected to said first junction and to a second potential source;

a second capacitor connected to said second junction and to a third potential source; and means connecting the inverting input terminal of said first operational transconductance amplifier to said second junction.

18. An operational transconductance amplifier programmable filter circuit comprising a first operational transconductance amplifier having a positive input terminal, an inverting input terminal, and an output terminal;

a first potential source connected to said positive input terminal;

a second operational transconductance amplifier having a second positive input terminal, connecting means including a first junction connecting said second positive input terminal to said output terminal, a second inverting input terminal, a second output terminal, a second connecting means including a second junction connected to said second output terminal and an operational amplifier connected to said second junction, said operational amplifier having an inverting input terminal and having an output connected to its inverting terminal and also to a voltage divider connected to ground with an intermediate point thereof connected to the inverting input terminal of said second operational transconductance amplifier;

a capacitor connected to said first junction and to a second potential source;

a second capacitor connected to said second junction and to a third potential source; and means connecting the inverting input terminal of said first operational transconductance amplifier to said second junction.

19. An operational transconductance amplifier programmable filter circuit comprising:

three groups of said operational transconductance amplifier programmable filter circuits connected in series wherein each group comprises:

a first operational transconductance amplifier having a positive input terminal, an inverting input terminal, and an output terminal;

a first potential source connected to said positive input terminal;

a second operational transconductance amplifier having a second positive input terminal, connecting means including a first junction connecting said second positive input terminal to said output terminal, a second inverting input terminal, a second output terminal, a second connecting means including a second junction connected to said second output terminal and an operational amplifier connected to said second junction, said operational amplifier having an inverting input terminal and having an output connected to the inverting input terminal of said second operational transconductance amplifier;

a capacitor connected to said first junction and to a second potential source;

a second capacitor connected to said second junction and to a third potential source; and means connecting the inverting input terminal of said first operational transconductance amplifier to said second junction and to an input terminal of said operational amplifier;

control circuit means and bias circuit means connected to each of said groups;

a second operational amplifier connected to an input circuit of a first of said groups; and a third operational amplifier connected to an output of a third of said groups.

* * * * *